United States Patent
Oh et al.

(10) Patent No.: US 8,294,164 B2
(45) Date of Patent: Oct. 23, 2012

(54) LIGHT-EMITTING DEVICE USING CLAD LAYER CONSISTING OF ASYMMETRICAL UNITS

(75) Inventors: Jae-Eung Oh, Gyeonggi-do (KR); Young-Kyun Noh, Daejeon (KR); Bun-Hei Koo, Seoul (KR)

(73) Assignee: WOOREE LST Co. Ltd., Gyeonggi-do (KR)

( * ) Notice: Subject to any disclaimer, the term of this patent is extended or adjusted under 35 U.S.C. 154(b) by 104 days.

(21) Appl. No.: 12/904,342

(22) Filed: Oct. 14, 2010

(65) Prior Publication Data
US 2011/0084249 A1  Apr. 14, 2011

Related U.S. Application Data

(63) Continuation of application No. PCT/KR2009/001844, filed on Apr. 10, 2009.

(30) Foreign Application Priority Data
Apr. 15, 2008 (KR) .................. 10-2008-0034742

(51) Int. Cl.
*H01L 33/00* (2010.01)
(52) U.S. Cl. ............... 257/97; 257/94; 257/15; 257/196
(58) Field of Classification Search .......... 257/94, 257/97, 15, 196, 96, 103, 14, 18, 615, E33.031–E33.034, 257/E33.028, E33.027
See application file for complete search history.

(56) References Cited

U.S. PATENT DOCUMENTS

| | | | |
|---|---|---|---|
| 2005/0285125 A1* | 12/2005 | Kim et al. ................. | 257/94 |
| 2007/0063207 A1 | 3/2007 | Tanizawa et al. | |

FOREIGN PATENT DOCUMENTS

| | | |
|---|---|---|
| KR | 10-0714553 B1 | 4/2007 |
| KR | 10-0755587 B1 | 8/2007 |
| KR | 10-2007-0098031 A | 10/2007 |

* cited by examiner

*Primary Examiner* — Telly Green
(74) *Attorney, Agent, or Firm* — Samuel Digirolamo; Husch Blackwell LLP

(57) ABSTRACT

The present invention relates to a light-emitting device using a clad layer consisting of asymmetric units, wherein the clad layer is provided by repeatedly stacking a unit having an asymmetric energy bandgap on upper and lower portions of an active layer, and the inflow of both electrons and holes into the active layer is arbitrarily controlled through the clad layer, so that the internal quantum efficiency can be improved. The light-emitting device using the clad layer consisting of the asymmetric units according to the present invention is characterized in that the clad layer is provided on at least one of the upper and lower portions of the active layer and consists of one or plural units, wherein the unit has a structure in which the first to $n^{th}$ unit layers (n is a natural number equal to or greater than three) having different energy bandgaps are sequentially stacked and has an asymmetric energy band diagram.

6 Claims, 11 Drawing Sheets

LIGHT-EMITTING DEVICE USING CLAD LAYER CONSISTING OF ASYMMETRICAL UNITS

CROSS-REFERENCE TO RELATED APPLICATION

This application is a continuation application of the prior International Application PCT Application No. PCT/KR2009/001844 filed on Apr. 10, 2009, which claims the benefit of priority from Korean Patent Application No. 10-2008-0034742 filed on Apr. 15, 2008. The disclosures of International Application PCT Application No. PCT/KR2009/001844 and Korean Patent Application No. 10-2008-0034742 are incorporated herein by reference.

BACKGROUND OF INVENTION

The present invention relates to a light-emitting device using a clad layer consisting of asymmetric units, and, more particularly, to a light-emitting device using a clad layer consisting of asymmetric units, wherein the clad layer is provided by repeatedly stacking a unit having an asymmetric energy bandgap on upper and lower portions of an active layer, and the inflow of both electrons and holes into the active layer is arbitrarily controlled through the clad layer, so that the internal quantum efficiency can be improved.

As illustrated in FIG. 1, a light-emitting device is basically composed of an n-type semiconductor layer 10 providing electrons, a p-type semiconductor layer 20 providing holes, and an active layer 30 emitting light by combining electrons and holes.

In order to improve the light-emitting performance of this light-emitting device, it is necessary to maximize its internal quantum efficiency (IQE). The IQE refers to the number of photons compared to the number of recombined electrons. A characteristic that allows the electrons and holes to flow into the active layer 30 upon the application of a voltage, a characteristic that effectively confines the electrons and holes in the active layer 30, a characteristic that recombines the electrons and holes in the active layer 30, and so on should be generally considered to improve the IQE.

The prior arts suggest a method for forming an electron blocking layer (EBL) having a large energy bandgap between an active layer and a p-type semiconductor layer and a method for forming a symmetric superlattice layer as a clad layer between an active layer and an n-type semiconductor layer and between the active layer and a p-type semiconductor layer so as to improve the IQE.

The method for forming the EBL is to ultimately improve the recombination rate of electrons and holes in the active layer by confining the electrons in the active layer by preventing the electrons which have flowed from the n-type semiconductor layer into the active layer from moving to the p-type semiconductor layer. However, although this method has an advantage that prevents the electrons from moving to the p-type semiconductor layer due to the EBL's conduction band discontinuity, it also has a disadvantage that limitedly improves the IQE because the holes having a larger mass than the electrons cannot flow into the active layer due to the EBL's valence band discontinuity. FIG. 2 illustrates an energy bandgap of a light-emitting device having an EBL 21 provided between an active layer and a p-type semiconductor layer. As can be seen, the EBL 21 prevents the movement of electrons so that the electrons can be confined in the active layer but also prevents holes from smoothly flowing into the active layer.

Next, the method for forming the symmetric superlattice layer on upper and lower portions of the active layer has an advantage that improves the inflow of holes from the p-type semiconductor layer through a miniband defined by the superlattice layer but has a disadvantage that cannot effectively prevent electrons which have flowed into the active layer from moving to the p-type semiconductor layer. FIG. 3 illustrates an energy bandgap of a light-emitting device having a symmetric superlattice layer provided on upper and lower portions of an active layer. As can be seen, the superlattice layer improves the inflow of holes but cannot prevent the outflow of electrons from the active layer.

SUMMARY OF INVENTION

The present invention has been conceived to solve the above-described problems and it is an object of the present invention to provide a light-emitting device using a clad layer consisting of asymmetric units, wherein the clad layer is provided by repeatedly stacking a unit having an asymmetric energy bandgap on upper and lower portions of an active layer, and the inflow of both electrons and holes into the active layer is arbitrarily controlled through the clad layer, so that the internal quantum efficiency can be improved.

In order to achieve the above object of the present invention, there is provided a light-emitting device using a clad layer consisting of asymmetric units, wherein the clad layer is provided on at least one of upper and lower portions of an active layer and consists of one or plural units, wherein the unit has a structure in which the first to nth unit layers (n is a natural number equal to or greater than three) having different energy bandgaps are sequentially stacked and has an asymmetric energy band diagram.

The first to nth unit layers (n is a natural number equal to or greater than three) which constitute the unit are made of different materials. When the clad layer consists of the plural units, each of the units has a different energy band diagram. In addition, the first to nth unit layers (n is a natural number equal to or greater than three) which constitute the unit may have different thicknesses and bandgaps.

Moreover, the energy bandgap size of the first to nth unit layers (n is a natural number equal to or greater than three) which constitute the unit of the clad layer provided on the lower portion of the active layer decreases in the order of the first to nth unit layers, and the energy bandgap size of the first to nth unit layers (n is a natural number equal to or greater than three) which constitute the unit of the clad layer provided on the upper portion of the active layer increases in the order of the first to nth unit layers.

On the contrary, the energy bandgap size of the first to nth unit layers (n is a natural number equal to or greater than three) which constitute the unit of the clad layer provided on the lower portion of the active layer may increase in the order of the first to nth unit layers, and the energy bandgap size of the first to nth unit layers (n is a natural number equal to or greater than three) which constitute the unit of the clad layer provided on the upper portion of the active layer may decrease in the order of the first to nth unit layers.

In the meantime, each of the unit layers constituting the unit is made of a III-V nitride semiconductor or II-VI oxide semiconductor, the III-V nitride semiconductor is composed of a material included in the general formula, $In_x(Al_yGa_{1-y})N$ ($0 \leq x \leq 1$, $0 \leq y \leq 1$), and the first to nth unit layers (n is a natural number equal to or greater than three) have different chemical compositions. Further, the II-VI oxide semiconductor is composed of a material included in the general formula, $Mg_x(Cd_yZn_{1-y})O$ ($0 < x < 0.4$, $0 \leq y \leq 0.4$), and the first to nth unit layers (n is a natural number equal to or greater than three) have different chemical compositions.

ADVANTAGEOUS EFFECTS

The light-emitting device using the clad layer consisting of the asymmetric units according to the present invention has the following effects.

As the clad layer consists of one or more units and the unit consists of three or more unit layers having different energy bandgaps and has the asymmetric energy band diagram, the inflow efficiency of the holes and the confinement efficiency of the incoming electrons and holes in the active layer can be improved, and ultimately the internal quantum efficiency of the light-emitting device can be improved.

These and other objects and advantages of the present invention will become more apparent to those skilled in the art after considering the following detailed specification taken in conjunction with the accompanying drawings.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein. Like numbers utilized throughout the various Figures designate like or similar parts or structure.

DETAILED DESCRIPTION

According to the present invention, a light-emitting device having a clad layer provided on at least one of upper and lower portions of an active layer is characterized in that the lower clad layer and the upper clad layer provided respectively on the upper and lower portions of the active layer have stepped energy bandgaps, respectively, so that their energy band diagrams are asymmetric in shape. Additionally, each of the lower clad layer and the upper clad layer has three or more energy bandgaps. For this purpose, each of the lower clad layer and the upper clad layer is made of three or more different materials.

Figure 1:
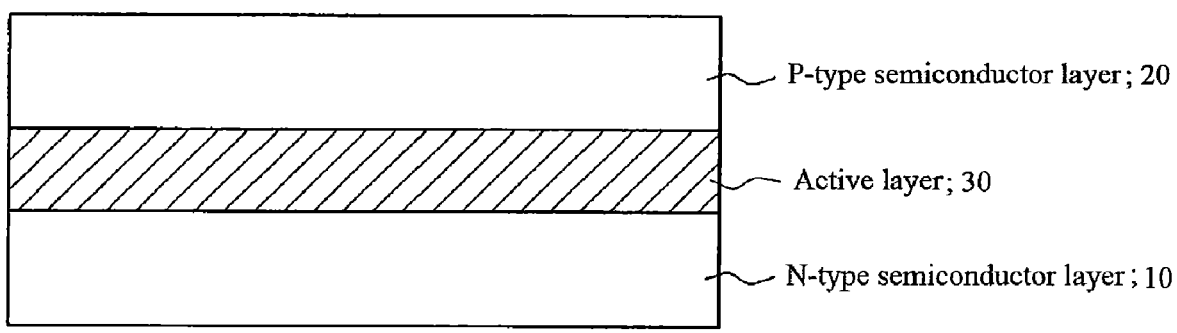
FIG. 1 is a structure view of a general light-emitting device.
Figure 2:
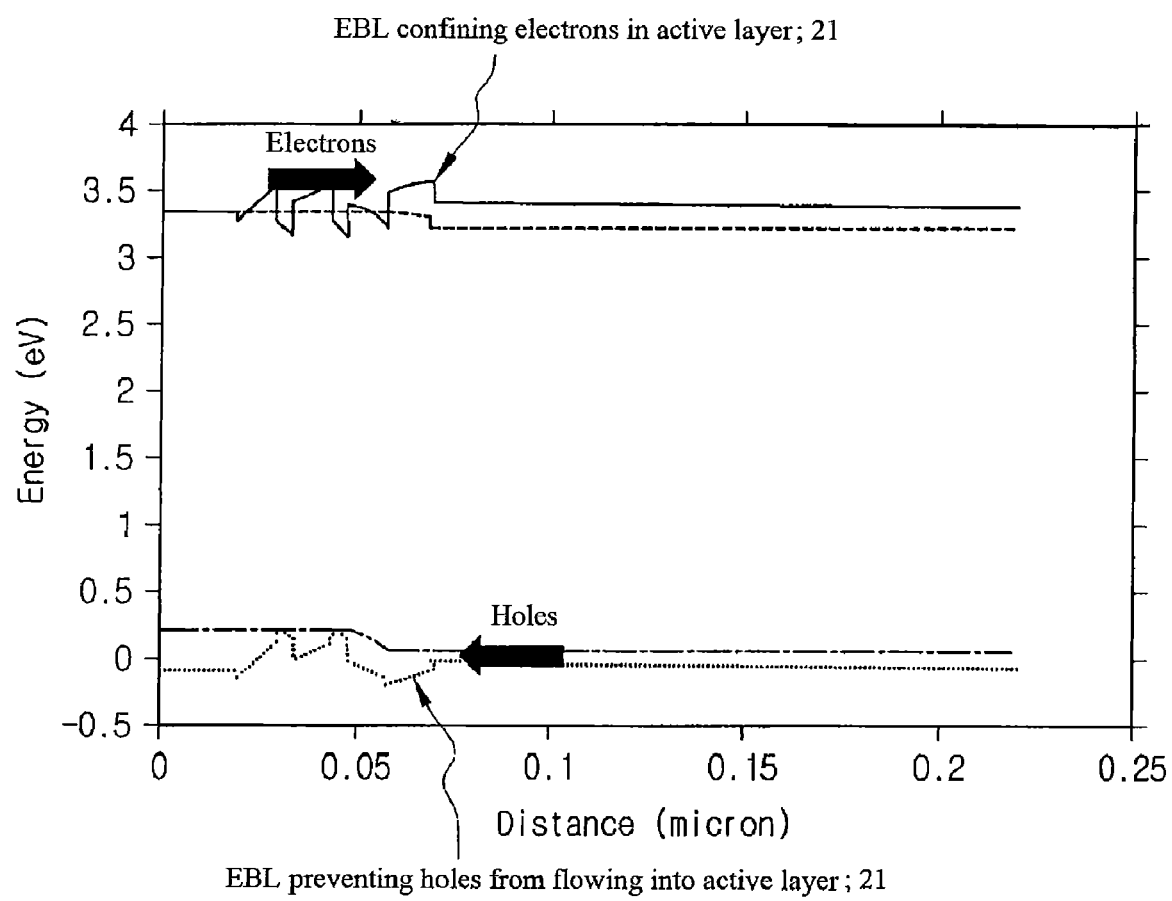
FIG. 2 is a graph showing an energy bandgap of a light-emitting device having an EBL provided between an active layer and a p-type semiconductor layer.
Figure 3:
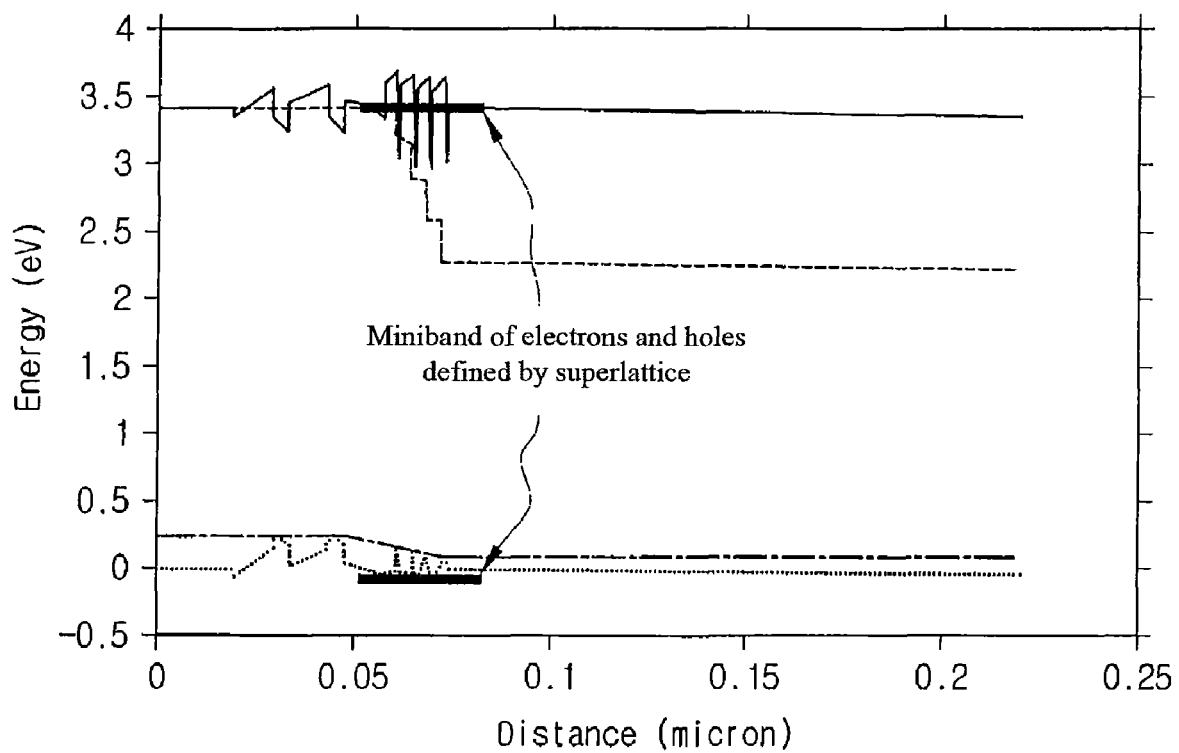
FIG. 3 is a graph showing an energy bandgap of a light-emitting device having a symmetric superlattice layer provided on upper and lower portions of an active layer.
Figure 4:
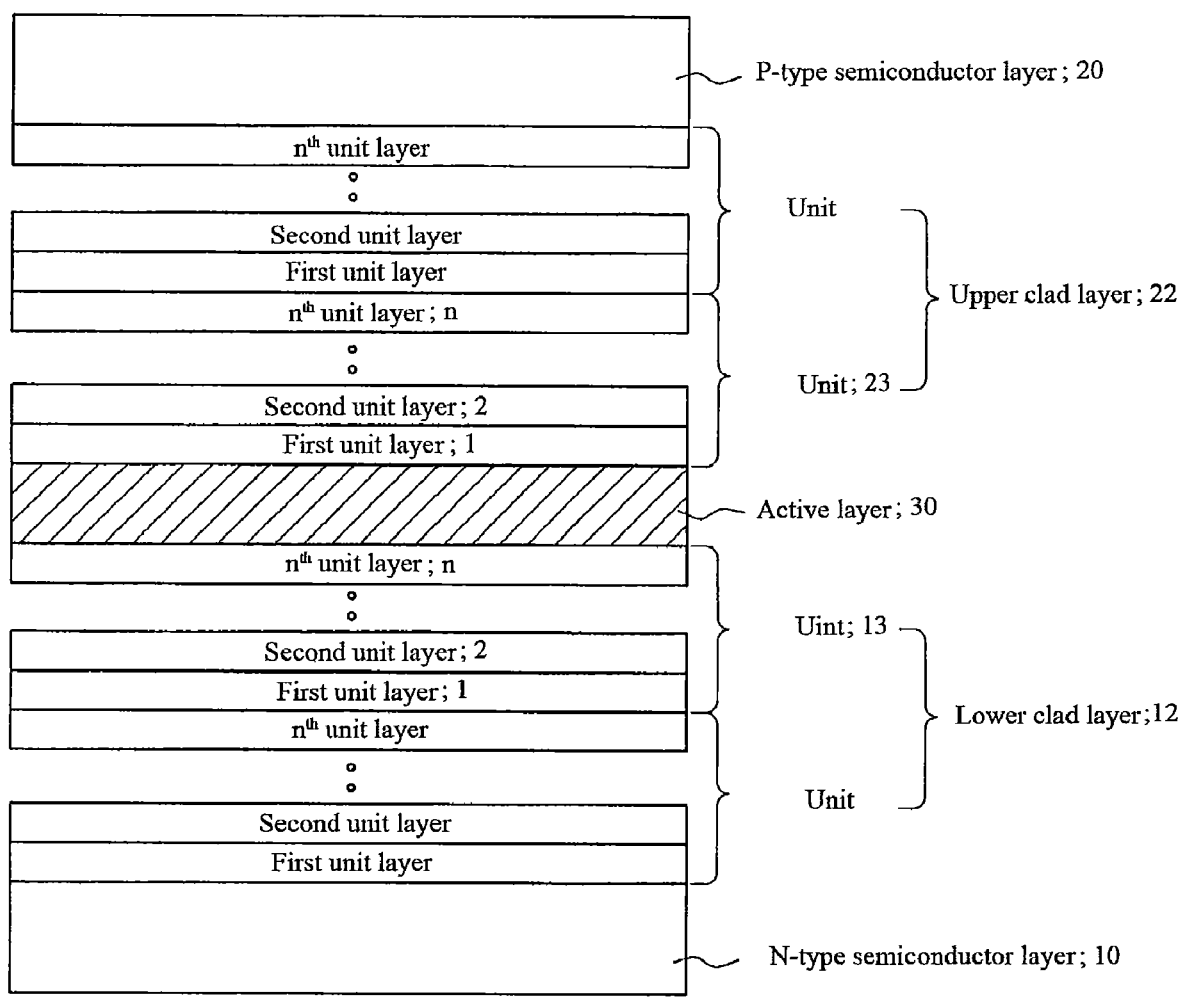
FIG. 4 is a sectional structure view of a light-emitting device using a clad layer consisting of asymmetric units according to an embodiment of the present invention.

Hereinafter, a light-emitting device using a clad layer consisting of asymmetric units according to an embodiment of the present invention will be described in detail with reference to the attached drawings. FIG. 4 is a sectional structure view of the light-emitting device using the clad layer consisting of the asymmetric units according to the embodiment of the present invention.

As illustrated in FIG. 4, the light-emitting device using the clad layer consisting of the asymmetric units according to the embodiment of the present invention has a structure in which an n-type semiconductor layer 10, a lower clad layer 12, an active layer 30, an upper clad layer 22, and a p-type semiconductor layer 20 are sequentially stacked. Although FIG. 4 shows a state where the lower clad layer 12 and the upper clad layer 22 are provided on the lower and upper portions of the active layer 30, respectively, it is possible for only the lower clad layer 12 or the upper clad layer to be provided 22.

Each of the lower clad layer 12 and the upper clad layer 22 has a structure in which one or more units 13 or 23 are stacked, and the unit 13 or 23 consists of three or more unit layers, e.g., the first to nth unit layers 1, 2, ... and n (n is a natural number equal to or greater than three).

Each of the unit layers 1, 2, ... and n constituting the unit 13 or 23 has a different energy bandgap, so the energy band diagram of the unit 13 or 23 is asymmetric in shape. The fact that each of the unit layers 1, 2, ... and n constituting the unit 13 or 23 has a different energy bandgap indicates that each of the unit layers 1, 2, ..., 3 is made of a different material.

In addition, when the lower clad layer 12 or the upper clad layer 22 consists of two or more units, each unit may have a different energy band diagram. For example, when the lower clad layer 12 or the upper clad layer 22 consists of a first unit and a second unit, if the first unit consists of the first to nth unit layers (n is a natural number equal to or greater than three) and the second unit consists of the first to nth unit layers (n is a natural number equal to or greater than three), the first to nth unit layers of the first unit have different energy bandgaps from the first to nth unit layers of the second unit, respectively. In other words, they are made of different materials.

Furthermore, each of the unit layers 1, 2, . . . and n constituting the unit 13 or 23 may have a different thickness. Still furthermore, when the lower clad layer 12 or the upper clad layer 22 consists of two or more units, each unit may have a different thickness.

Figure 5:
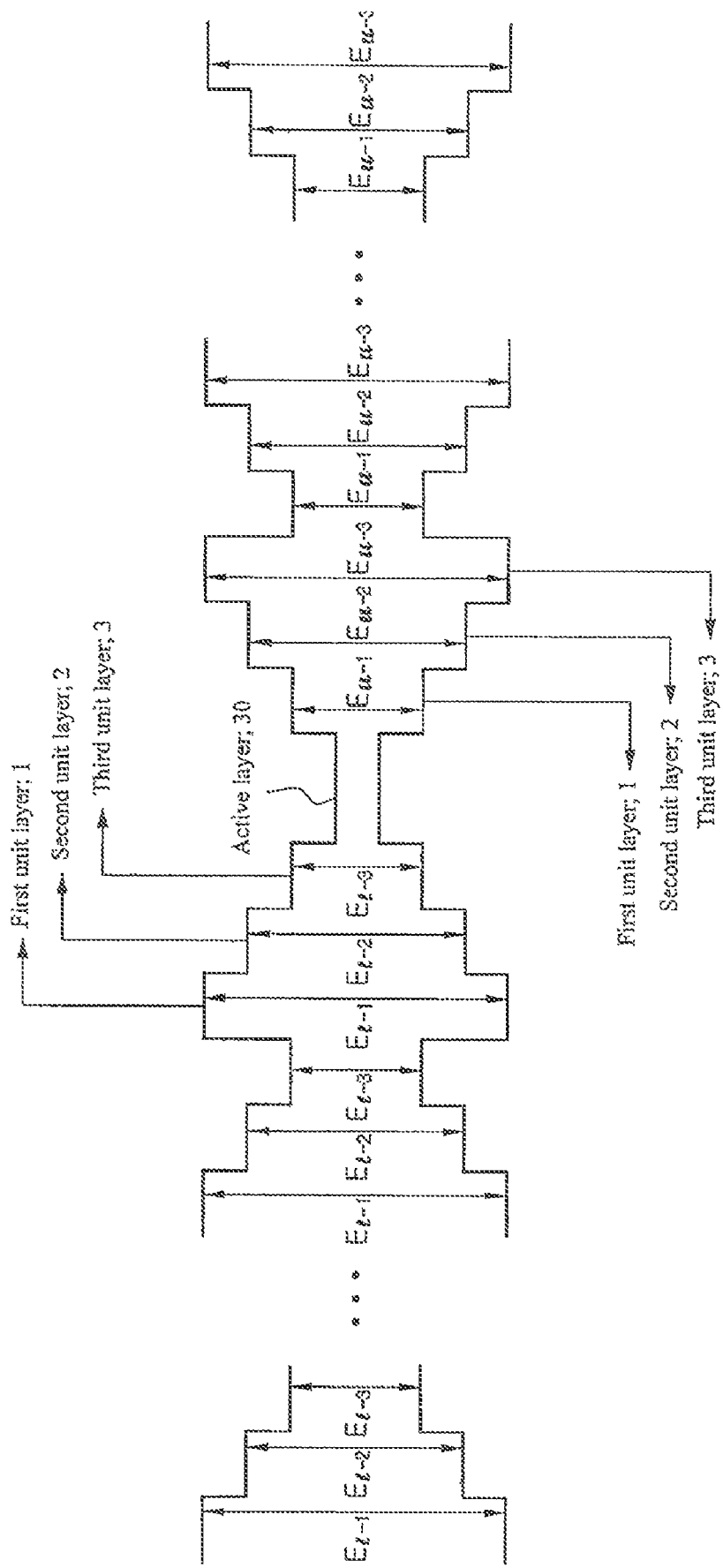
FIG. 5 is a view showing energy bandgaps of the light-emitting device using the clad layer consisting of the asymmetric units according to the embodiment of the present invention.

FIG. 5 illustrates the energy band diagrams of the lower clad layer 12, the active layer 30, and the upper clad layer 22 in the above structure. As described above, the lower clad layer 12 or the upper clad layer 22 consists of one or more units 13 or 23, and each unit consists of three or more unit layers 1, 2, . . . and n. Here, FIG. 5 shows a state where one unit 13 or 23 consists of three unit layers (the first layer 1, the second layer 2, and the third layer 3) by way of example.

As illustrated in FIG. 5, the three unit layers 1, 2 and 3 which constitute the unit 13 of the lower clad layer 12 and the unit 23 of the upper clad layer 22 have different energy bandgaps, and each unit 13 or 23 has an asymmetric energy band diagram.

With respect to the arrangement of the three unit layers 1, 2 and 3 which constitute the unit 13 of the lower clad layer 12 and the unit 23 of the upper clad layer 22, it is preferable that the three unit layers 1, 2 and 3 of the unit 13 of the lower clad layer 12 should be arranged so that the energy bandgap size can decrease in the order of the first unit layer El-1, the second unit layer El-2, and the third unit layer El-3, and it is preferable that the three unit layers 1, 2 and 3 of the unit 23 of the upper clad layer 22 should be arranged so that the energy bandgap size can increase in the order of the first unit layer Eu-1, the second unit layer Eu-2, and the third unit layer Eu-3. Here, the energy band diagram of the unit 13 of the lower clad layer 12 and the energy band diagram of the unit 23 of the upper clad layer 22 may be symmetric around the active layer 30. In this case, each of the first unit layer 1, the second unit layer 2, and the third unit layer 3 which constitute the unit 13 of the lower clad layer 12 may be made of the same material as each of the third unit layer 3, the second unit layer 2, and the first unit layer 1 which constitute the unit 23 of the upper clad layer 22.

Figure 6:
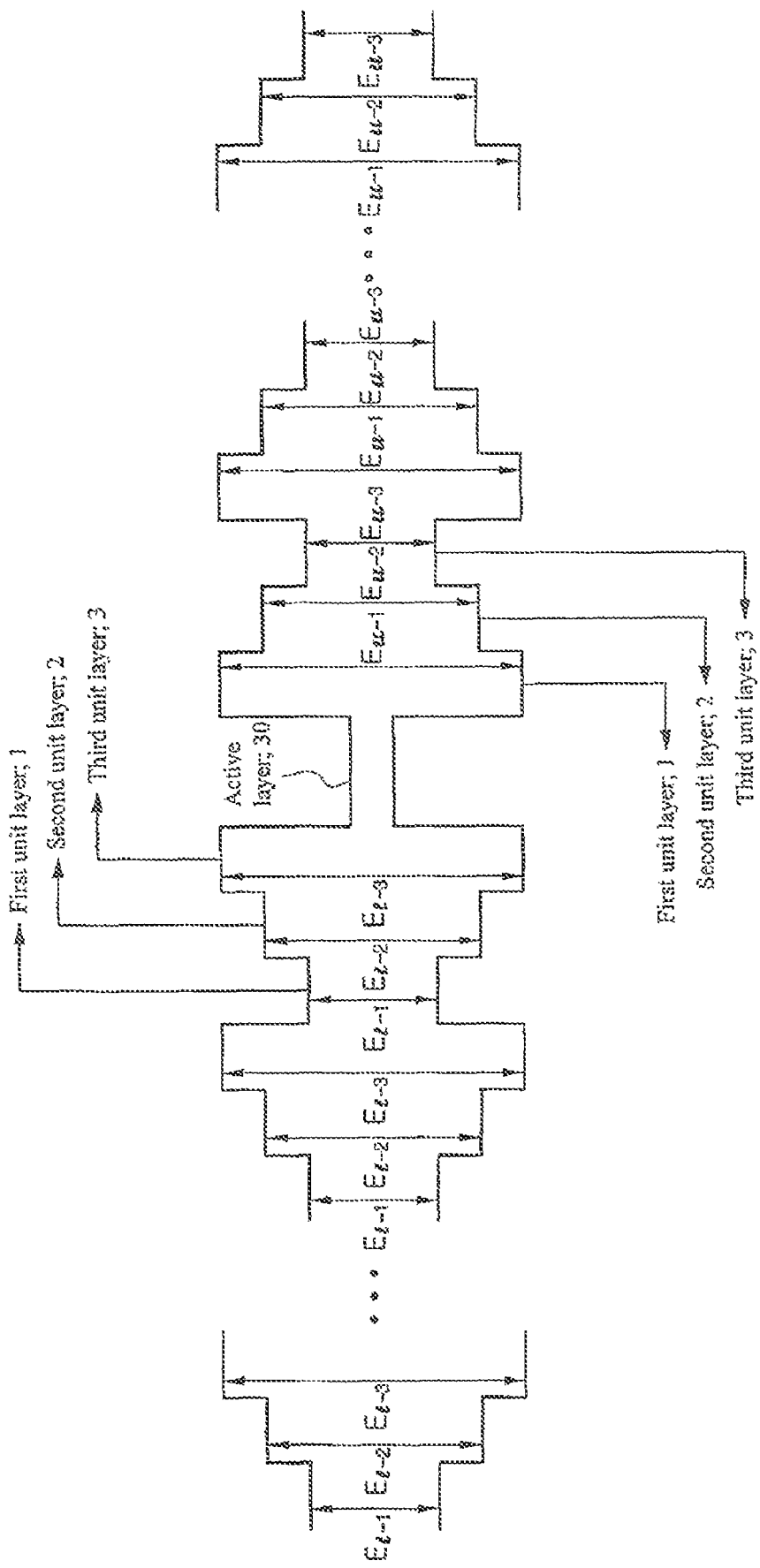
FIG. 6 is a view showing energy bandgaps of a light-emitting device using a clad layer consisting of asymmetric units according to another embodiment of the present invention.

According to another embodiment of the present invention, the arrangement of the lower clad layer 12 may be made so that the energy bandgap size can increase in the order of the first unit layer El-1, the second unit layer El-2, and the third unit layer El-3, and the arrangement of the upper clad layer 22 may be made so that the energy bandgap size can decrease in the order of the first unit layer Eu-1, the second unit layer Eu-2, and the third unit layer Eu-3. That is, the energy band diagrams of the lower clad layer 12 and the upper clad layer 22 can be designed as shown in FIG. 6. Also in this case, the energy band diagram of the unit 13 of the lower clad layer 12 and the energy band diagram of the unit 23 of the upper clad layer 22 may be symmetric around the active layer 30.

The light-emitting device using the clad layer 12 or 22 consisting of the asymmetric units 13 or 23 according to the embodiment of the present invention with the above-described structure can be applied to both a light-emitting device using a III-V nitride semiconductor and a light-emitting device using a II-VI oxide semiconductor.

For example, if the lower clad layer 12 and the upper clad layer 22 are made of the III-V nitride semiconductor, the first to nth unit layers 1, 2, . . . and n (n is a natural number equal to or greater than three) of the units 13 and 23 which constitute the lower clad layer 12 and the upper clad layer 22 may be composed of a material included in the general formula, $In_x(Al_yGa_{1-y})N$ ($0 \leq x \leq 1$, $0 \leq y \leq 1$), and if the lower clad layer and the upper clad layer are made of the II-VI oxide semiconductor, the first to nth unit layers (n is a natural number equal to or greater than three) of the units may be composed of a material included in the general formula, $Mg_x(Cd_yZn_{1-y})O$ ($0<x<0.4$, $0<y<0.4$).

In addition, it is preferable that the thickness of the lower clad layer 12 and the upper clad layer 22 should be appropriately designed in consideration of the energy bandgap of the material of the lower clad layer 12 and the upper clad layer 22, i.e., the material of each unit layer 1, 2, . . . or n of the unit 13 or 23, the tunneling effect, etc. As an example, the lower clad layer 12 and the upper clad layer 22 may have a thickness of 0.1 nm to 10 nm.

Figure 7:
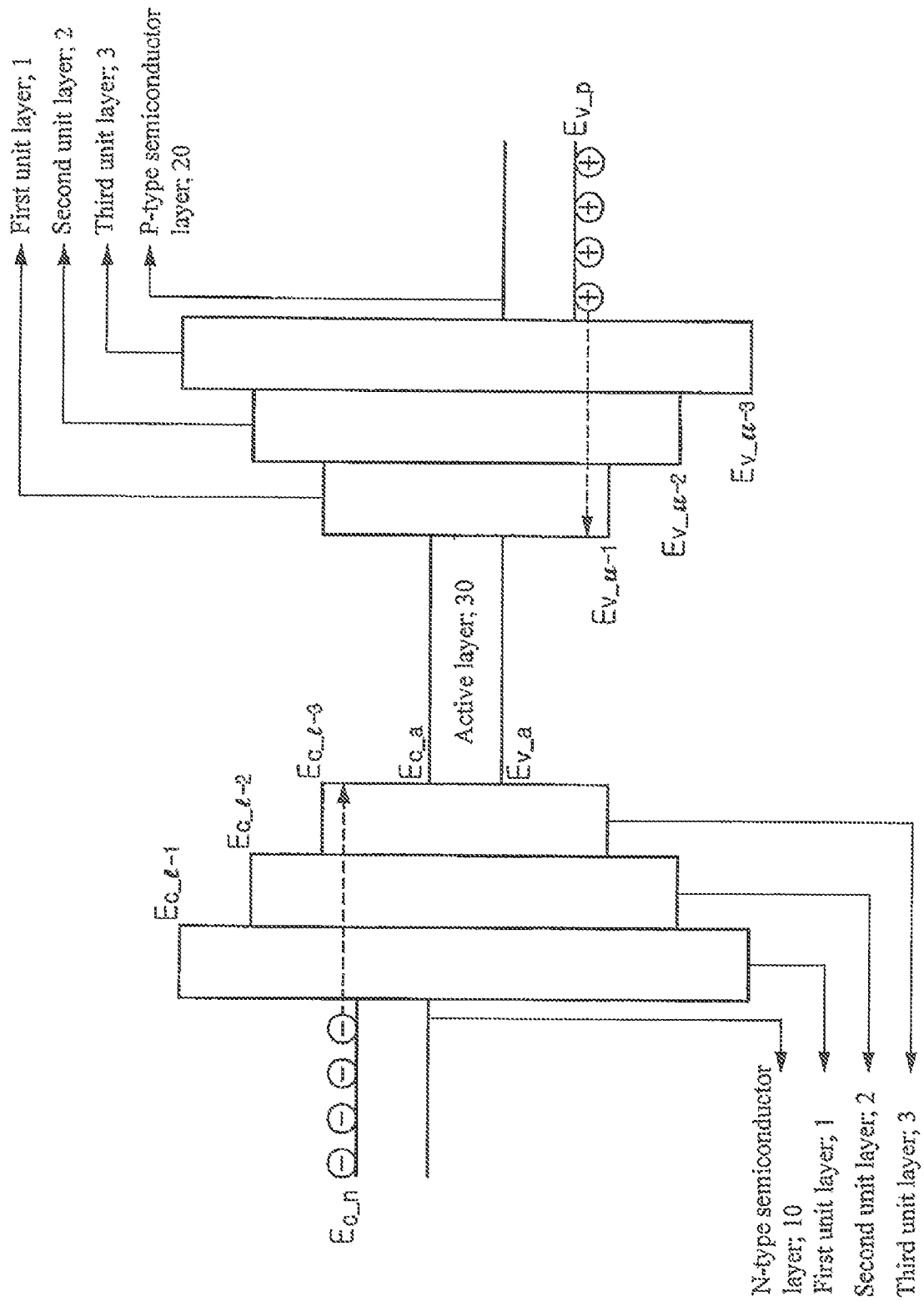
FIGS. 7 and 8 are views showing energy band diagrams of the light-emitting device using the clad layer consisting of the asymmetric units according to the embodiment of the present invention, when an electric field is not applied thereto and when the electric field is applied thereto, respectively.
Figure 8:
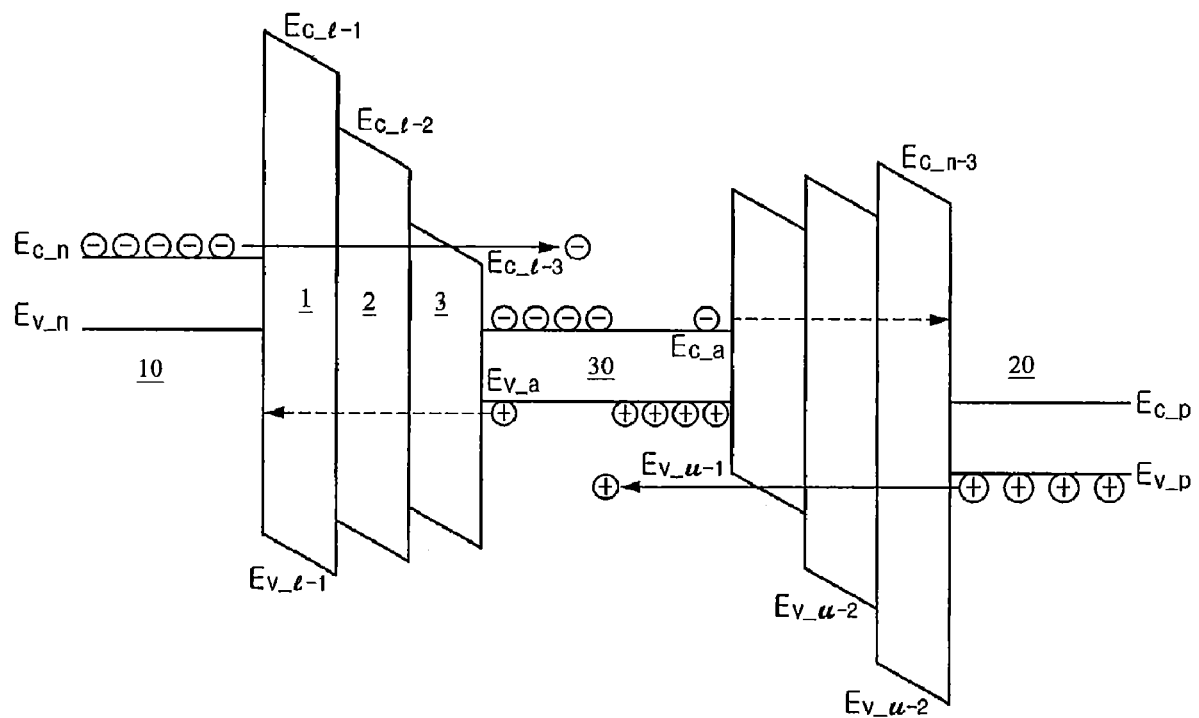

The characteristics of the light-emitting device using the clad layer 12 or 22 consisting of the asymmetric units according to the embodiment of the present invention with the above-described structure will be described below. FIGS. 7 and 8 are views showing energy band diagrams of the light-emitting device using the clad layer consisting of the asymmetric units according to the embodiment of the present invention, when an electric field is not applied thereto and when the electric field is applied thereto, respectively. FIGS. 7 and 8 illustrate a state where the lower clad layer and the upper clad layer consist of one unit 13 or 23 and the corresponding unit 13 or 23 consists of three unit layers 1, 2 and 3 by way of example.

First, the characteristic that confines the electrons and holes in the active layer 30 will be described below. The inflow efficiency of the electrons and holes flowing into the active layer 30 respectively from the n-type semiconductor layer 10 and the p-type semiconductor layer 20 must be good to improve the confinement characteristic of the electrons and holes. Moreover, it is necessary to prevent the electrons and holes which flowed into the active layer 30 from going out of the active layer 30. This confinement characteristic of the electrons and holes can be comprehended by applying the electric field to the light-emitting device.

As illustrated in FIG. 7, in a state where the electric field is not applied, since the energy level Ec_n of the conduction band of the n-type semiconductor layer 10 is lower than the energy level Ec_l-3 of the conduction band of the third unit layer 3 (of the unit of the lower clad layer), the electrons of the n-type semiconductor layer 10 cannot flow into the active layer 30. Additionally, in a state where the electric field is not applied, since the energy level Ev_p of the valence band of the p-type semiconductor layer 20 is higher than the energy level Ev_u-1 of the valence band of the first unit layer 1 (of the unit of the upper clad layer), the holes of the p-type semiconductor layer 20 cannot flow into the active layer 30.

In this situation, when the electric field is applied in the direction from the n-type semiconductor layer 10 to the p-type semiconductor layer 20, as shown in FIG. 8, each of the unit layers 1, 2 and 3 which constitute the unit of the lower clad layer and the unit of the upper clad layer has an inclined energy band level. Accordingly, the energy level Ec_l-3 of the conduction band of the third unit layer 3 (of the unit of the lower clad layer) is lower than the energy level Ec_n of the conduction band of the n-type semiconductor layer 10, so that the electrons of the n-type semiconductor layer 10 flow into the active layer 30 due to the F-N tunneling effect, etc. In addition, the energy level Ev_u-1 of the valence band of the first unit layer 1 (of the unit of the upper clad layer) is higher than the energy level Ev_p of the valence band of the p-type semiconductor layer 20, so that the holes of the p-type semiconductor layer 20 flow into the active layer 30 due to the F-N tunneling effect, etc. For reference, it is preferable that the energy bandgaps and thicknesses of the first to nth unit layers which constitute the unit of the lower clad layer and the unit of the upper clad layer should be appropriately designed in consideration of the tunneling effect, etc.

In a state where the electrons and holes have flowed into the active layer 30 as described above, since the energy level Ec_a of the conduction band of the active layer 30 is lower than the energy level Ec_u-3 of the conduction band of the third unit layer 3 (of the unit of the upper clad layer), the electrons within the active layer 30 cannot be discharged to the outside of the active layer 30. Additionally, since the energy level Ev_a of the valence band of the active layer 30 is higher than the energy level Ev_l-1 of the valence band of the first unit layer 1 (of the unit of the lower clad layer), the holes remain confined in the active layer 30.

As set forth herein, when the electric field is applied to the light-emitting device according to the embodiment of the present invention, the electrons flow into the active layer 30 from the n-type semiconductor layer 10 and the holes flow into the active layer 30 from the p-type semiconductor layer 20. The electrons and holes which have flowed into the active layer 30 are confined in the active layer 30 by the energy barriers defined by the lower clad layer and the upper clad layer. As a result, the internal quantum efficiency (IQE) of the light-emitting device is improved.

Figure 9:
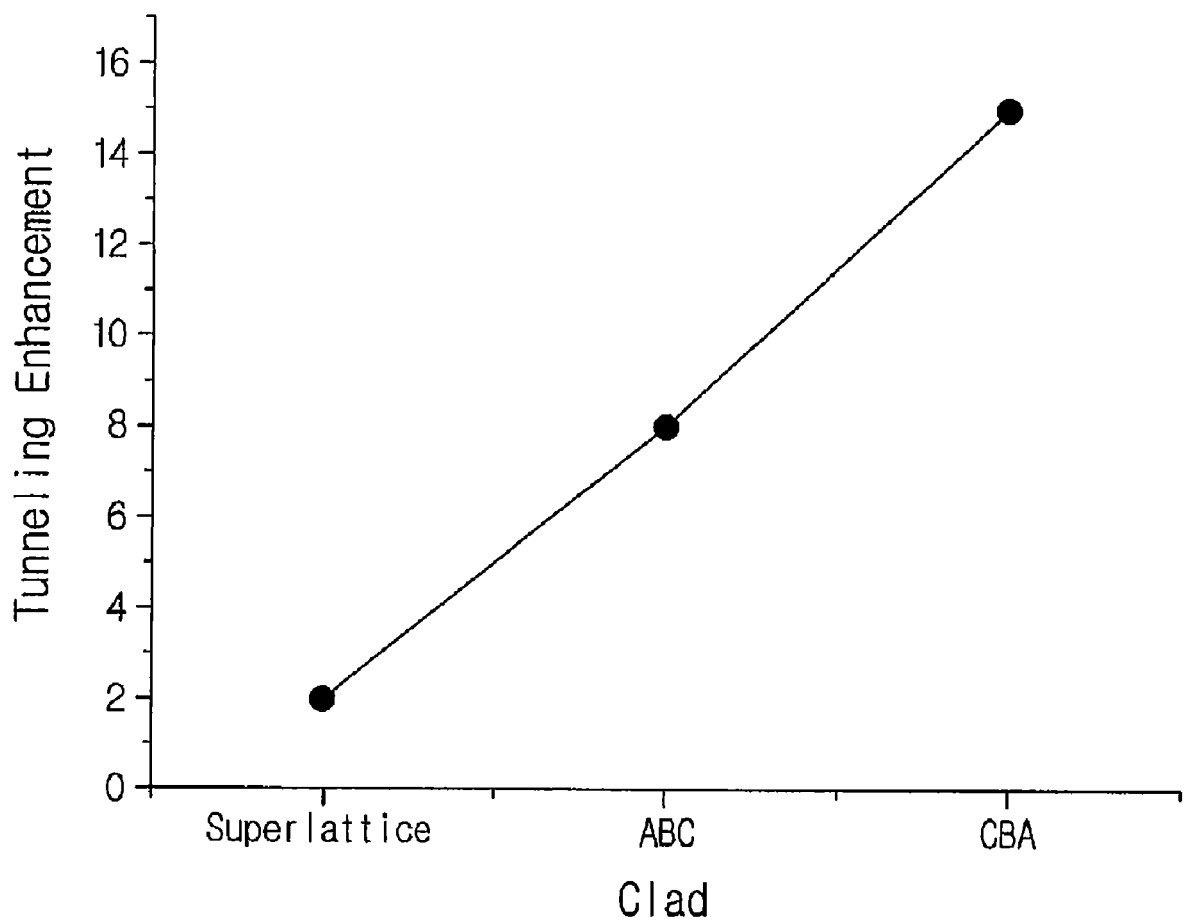
FIG. 9 is a graph showing the tunneling enhancement characteristics of the conventional light-emitting device using the symmetric superlattice layer as the clad layer, the light-emitting device according to the embodiment of the present invention (A>B>C) (ABC of FIG. 8) wherein the unit of the upper clad layer consists of first, second, and third unit layers arranged in the order that the energy bandgap size decreases, and the light-emitting device according to the embodiment of the present invention (C<B<A) (CBA of FIG. 8) wherein the unit of the upper clad layer consists of first, second, and third unit layers arranged in the order that the energy bandgap size increases.

In the meantime, the tunneling enhancement effect brought about by the application of the electric field in the light-emitting device according to the present invention will be described in comparison with the prior art. FIG. 9 is a graph showing the tunneling enhancement characteristics of the conventional light-emitting device using the symmetric superlattice layer as the clad layer, the light-emitting device according to the embodiment of the present invention (A>B>C) (ABC of FIG. 9) wherein the unit of the upper clad layer consists of the first, second, and third unit layers arranged in the order that the energy bandgap size decreases, and the light-emitting device according to the embodiment of the present invention (C<B<A) (CBA of FIG. 9) wherein the unit of the upper clad layer consists of the first, second, and third unit layers arranged in the order that the energy bandgap size increases.

As illustrated in FIG. 9, it can be seen that the tunneling enhancement characteristic of the inventive light-emitting device using the asymmetric clad layer is superior to the tunneling enhancement characteristic of the conventional light-emitting device using the symmetric superlattice layer by 4 to 8 times.

Figure 10:
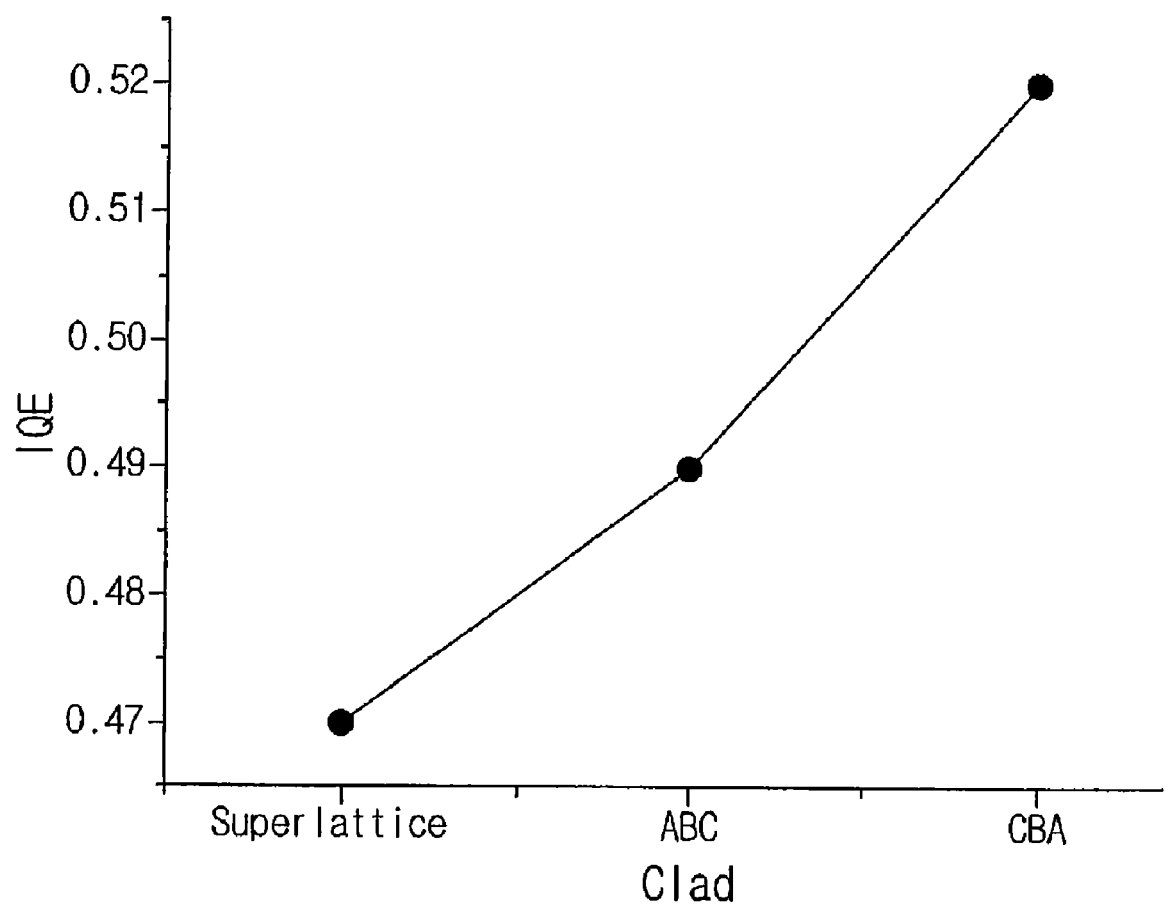
FIG. 10 is a graph showing the internal quantum efficiency of the conventional light-emitting device using the symmetric superlattice layer, the light-emitting device according to the embodiment of the present invention (A>B>C) (ABC of FIG. 9) wherein the unit of the upper clad layer consists of first, second, and third unit layers arranged in the order that the energy bandgap size decreases, and the light-emitting device according to the embodiment of the present invention (C<B<A) (CBA of FIG. 9) wherein the unit of the upper clad layer consists of first, second, and third unit layers arranged in the order that the energy bandgap size increases.
Figure 11:
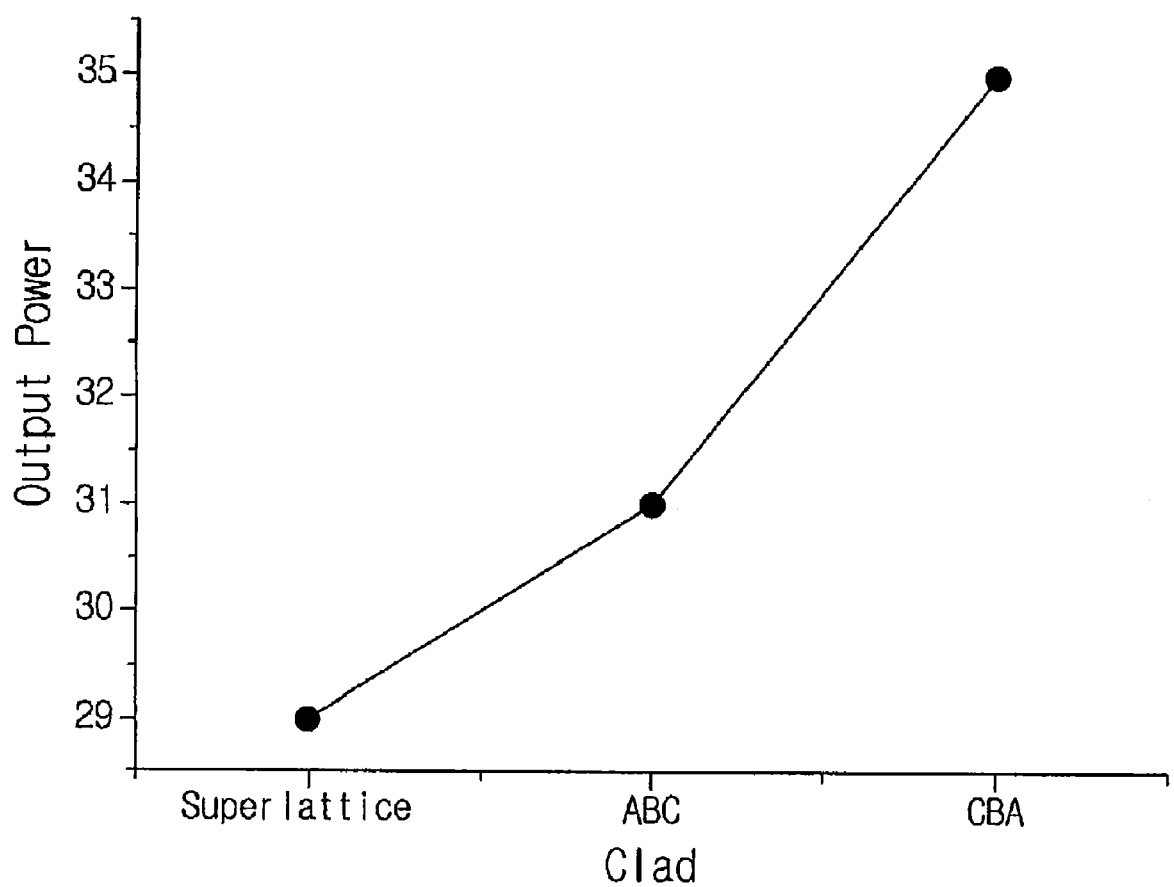
FIG. 11 is a graph showing the output power characteristics of the conventional light-emitting device using the symmetric superlattice layer and the inventive light-emitting device (ABC and CBA) using the asymmetric superlattice layer.

Next, the IQE and output power improvement effect of the light-emitting device according to the present invention will be described below. FIG. 10 is a graph showing the IQE of the conventional light-emitting device using the symmetric superlattice layer, the light-emitting device according to the embodiment of the present invention (A>B>C) (ABC of FIG. 10) wherein the unit of the upper clad layer consists of the first, second, and third unit layers arranged in the order that the energy bandgap size decreases, and the light-emitting device according to the embodiment of the present invention (C<B<A) (CBA of FIG. 10) wherein the unit of the upper clad layer consists of the first, second, and third unit layers arranged in the order that the energy bandgap size increases, and FIG. 11 is a graph showing the output power characteristics of the conventional light-emitting device using the symmetric superlattice layer and the inventive light-emitting device (ABC and CBA) using the asymmetric superlattice layer.

As illustrated in FIG. 10, while the IQE of the conventional light-emitting device is 0.47, the IQE of the inventive light-emitting device is 0.49,052, which shows the improvement of the IQE. In addition, as illustrated in FIG. 11, it can be seen that the output power of the inventive light-emitting device has been much more improved than that of the conventional light-emitting device.

The light-emitting device using the clad layer consisting of the asymmetric units according to the present invention can be used as the light-emitting device which improves the inflow efficiency of the electrons and holes into the active layer and the confinement efficiency of the electrons and holes in the active layer.

It is also understood that various modifications may be made to all of the various embodiments of the present invention without departing from the spirit and scope of the present invention.

Thus, there has been shown and described several embodiments of a light-emitting device using the clad layer consisting of the asymmetric units which fulfills all of the objects and advantages sought therefor. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present invention will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:
1. A light-emitting device comprising:
an n-type semiconductor layer;
a p-type semiconductor layer;
an active layer interposed between the n-type semiconductor layer and the p-type semiconductor layer and emitting light by electrons supplied from the n-type semiconductor layer and holes supplied from the p-type semiconductor layer; and
a clad layer having one or more units, the clad layer being provided between the p-type semiconductor layer and the active layer, wherein each unit has a structure in which a first to $n^{th}$ unit layers (n is a natural number equal to or greater than three) with different energy bandgaps are sequentially stacked and has an asymmetric energy band diagram,
wherein the energy bandgap sizes of the first to $n^{th}$ unit layers which constitute the unit of the clad layer provided on the upper portion of the active layer increase in the order of the first to $n^{th}$ unit layers, and
wherein the energy level of the valence band of the first unit layer nearest to the active layer is higher than that of the p-type semiconductor layer in a state where the electric field is applied in the direction from the n-type semiconductor layer to the p-type semiconductor layer while the energy level of the conduction band of the first unit layer nearest to the active layer is higher than that of the active layer in the state.
2. The light-emitting device of claim 1, wherein the energy bandgap sizes of the first to $n^{th}$ unit layers which constitute the unit of the clad layer provided on the lower portion of the active layer decrease in the order of the first to $n^{th}$ unit layers, and
wherein the energy level of the conduction band of the $n^{th}$ unit layer nearest to the active layer is lower than that of the n-type semiconductor layer in the state while the energy level of the valence band of the $n^{th}$ unit layer nearest to the active layer is lower than that of the active layer in the state.

3. The light-emitting device of claim 1, wherein the first to $n^{th}$ unit layers (n is a natural number equal to or greater than three) which constitute the unit have different thicknesses.

4. The light-emitting device of claim 1, wherein each of the unit layers constituting the unit is made of a III-V nitride semiconductor.

5. The light-emitting device of claim 4, wherein the III-V nitride semiconductor is composed of a material included in the general formula, $In_x(Al_yGa_{1-y})N$ ($0 \leq x \leq 1$, $0 \leq y \leq 1$), and the first to $n^{th}$ unit layers (n is a natural number equal to or greater than three) have different chemical compositions.

6. The light-emitting device of claim 1, wherein the clad layer has a thickness of 0.1 nm to 10 nm.

* * * * *